United States Patent [19]

Mohammadi et al.

[11] Patent Number: 4,807,003
[45] Date of Patent: Feb. 21, 1989

[54] HIGH-RELIABLITY SINGLE-POLY EEPROM CELL

[75] Inventors: Farrokh Mohammadi, Mountain View; Chan S. Pang, Sunnyvale, both of Calif.

[73] Assignee: National Semiconductor Corp., Santa Clara, Calif.

[21] Appl. No.: 220,927

[22] Filed: Jul. 15, 1988

Related U.S. Application Data

[63] Continuation of Ser. No. 944,378, Dec. 19, 1986, abandoned.

[51] Int. Cl.⁴ .......................................... H01L 29/78
[52] U.S. Cl. .................................. 357/23.5; 357/41; 357/59; 365/182
[58] Field of Search ......................... 357/23.5, 41, 59; 365/182, 184, 185

[56] References Cited

U.S. PATENT DOCUMENTS 4,477,825 10/1984 Yaron et al. ....................... 357/23.5

OTHER PUBLICATIONS

"A 5V-Only 116K EEPROM Utilizing Oxynitride Dielectrics and EEPROM Redundancy," Gupta et al., 1982 EIII International Solid-State Circuits Conference.
"An Improved Fabrication Process For Multi-level Polysilicon Structures", L. Farone, 1983 Symposium on ULSI Technology.
"High Temperature and Extended Endurance Characteristics of EEPROM", C. Jeng et al., 1983 IEDM 585.
"Thermal Nitridation of Silicon and Silicon Dioxide For Thin Gate Insulators", Nemetz et al., Solid State Technology, Feb. 1983.
"Oxynitride Film Yields Long-lived 64-K EEPROM Cells", S. Mehrotra et al., Electronics, Dec. 1, 1983.
"EEPROM Cell With HB (One Half Barrier Height) Oxide for VLSI", Nozzwa et al., 1984 VLSI.

*Primary Examiner*—Andrew J. James
*Assistant Examiner*—Mark Prenty
*Attorney, Agent, or Firm*—Limbach, Limbach & Sutton

[57] ABSTRACT

The present invention provides a single-poly electrically erasable programmable read only memory device which is formed in a semiconductor substrate of a first conductivity type. The memory device includes a pass cell comprising first and second regions of a second conductivity type, opposite to that of the first conductivity type, formed in the substrate. The first and second regions are separated by a first channel region formed by the substrate. A first conductive portion is formed over the first channel region and is separated from the first channel region by a dielectric material. A control cell comprising third and forth regions of the second conductivity type is also formed in the substrate. The third and forth regions are separated by a second channel region formed by the substrate. The first conductive portion extends over the second channel region and is separated from the second channel region by the dielectric material. The device also includes a memory cell comprising a second region and a fifth region of the second conductivity type formed in the substrate. The second and the fifth regions are separated by a third channel region formed by the substrates. A second conductive portion is formed over the third channel region and overlaps the second region. The second conductive portion is separated from the second region and the third channel region by the dielectric material.

9 Claims, 5 Drawing Sheets

FIG_1

FIG_2C

FIG_2D

FIG_2A

FIG_2B

FIG_3A

FIG_3B

FIG_3C

FIG_4A

FIG_4B

FIG_5

FIG_6

FIG_7

FIG_8

HIGH-RELIABLITY SINGLE-POLY EEPROM CELL

This is a continuation of co-pending application Ser. No. 944,378 filed on 12/19/86, now abandoned

TECHNICAL FIELD

This invention relates to semiconductor integrated circuits and, more particularly, to a single-poly electrically erasable programmable read only memory (EEPROM) cell.

BACKGROUND ART

U.S. Pat. No. 4,477,825, issued Oct. 16, 1984 to Yaron et al., describes a double-poly electrically erasable programmable read only memory (EEPROM) device that utilizes dual field effect transistors to control current flow through a channel region between source and drain regions. A floating gate, formed from a first layer of polycrystalline silicon, overlays the channel region. A control gate, formed from a second layer of polycrystalline silicon overlays the floating gate. To read the cell, the control gate is typically charged to draw electrons into the channel and to permit current flow. However, this effect may be blocked by the floating gate positioned between the channel and the control gate. The floating gate influences the current flow in the channel as a function of the charge trapped on the floating gate. This "double-poly" EEPROM cell is programmed by tunneling charge carriers on or off the floating gate with suitably applied electric fields that act across thin oxide layers; the size and thickness of the thin oxide layers are critically important to proper operation of the device.

The '825 Yaron et al. patent teaches a one-step etching process for locating and defining a thin oxide tunneling region. The borders of the oxide tunneling region are located interior to and displaced from the borders of both the encompassing field oxide layer and the edges of the overlaying gates. The polysilicon floating gate comprises two portions which are connected together by dual paths positioned on each side of the source to drain current path. One portion of the gate operates over the channel region as a memory transistor, while the other portion contains the tunneling region. The cell layout described in the Yaron et al. patent provides a high cell packing density and simultaneously segregates the thin oxide region from areas of objectionable mechanical and electrical stress. Also, the thin oxide is protected from future, edge degrading etching steps.

While double poly EEPROM cells provide a high density memory device and exhibit acceptable endurance, they are limited to use in commodity memory products and require a complex fabrication process.

EEPROM cells which utilize a single layer of polysilicon, on the other hand, while providing lower density than double poly cells, require a much simpler fabrication process and are suitable not only for memory devices, but also for logic and custom design applications.

Furthermore, "single-poly" EEPROM devices eliminate the inter-poly capacitance problem associated with double-poly devices. In a double-poly cell, to facilitate the double-poly structure, an oxide layer must be grown on the lower layer of polysilicon. Since only a weak oxide structure can be grown on polysilicon, double-poly devices exhibit leakage through the interpoly oxide layer. This leakage adversely effects device reliability. In a single-poly device, the dielectric oxide layer is grown on the semiconductor substrate, resulting in a strong, single-crystal oxide layer and elimination of the leakage problem associated with double-poly cells.

In a single poly device, both the floating gate and the control gate function are performed by a single polycrystalline silicon layer. In general, the floating gate function and the control gate function are performed by different areas of the single poly layer. For capacitive coupling between the floating gate and the control gate, which is used to transfer a switch voltage from the control gate to the floating gate so as to permit the write/erase operation of the floating gate, a thin tunnel-oxide MOS capacitor is generally used.

Examples of single poly EEPROM devices are disclosed by R. Cuppens, et al., "An EEPROM for Microprocessors and Custom Logic", SC-20 *IEEE J. of Solid State Cir.* 603 (1985); N. Matsukawa, et al., "A High Density Single-Poly Si Structure EEPROM with LB (Lower Barrier Height) Oxide for VLSI's", 1985 *Symposium on VLSI Technology:* and J. Miyamoto, et al., "High Performance Single Polysilicon EEPROM Cells". However, none of the single-poly cells disclosed in the above-referenced documents disclose a cell structure wherein the thin tunneling oxide regions are confined within the boundaries of the underlying drain region. Rather, in each of these cells, the edges of the thin tunneling oxide region are coincident either with a PN junction of the underlying drain region or with the boundary of an adjacent field oxide region, leading to the reliability problems discussed in the above-mentioned ÷852 Yaron et al. patent and larger cell size due to the larger effective tunnel oxide area.

SUMMARY OF THE INVENTION

An ideal single poly EEPROM device should be a device that is small in cell area. In addition, it should be reliable and the process for fabricating it should be simple.

Thus, it is a major object of the present invention to provide a single polysilicon layer EEPROM device that has a small cell area.

It is another object of the present invention to provide a single polysilicon layer EEPROM device that is reliable and easy to fabricate.

Accordingly, the present invention provides a single-poly electrically erasable programmable read only memory device which is formed in a semiconductor substrate of a first conductivity type. The memory device includes a pass cell comprising first and second regions of a second conductivity type, opposite to that of the first conductivity type, formed in the substrate. The first and second regions are separated by a first channel region formed by the substrate. A first conductive portion is formed over the first channel region and is separated from the first channel region by a dielectric material. A control cell comprising third and forth regions of the second conductivity type is also formed in the substrate. The third and forth regions are separated by second channel region formed by the substrate. The first conductive portion extends over the second channel region and is separated from the second channel region by the dielectric material. The device also includes a memory cell comprising a second region and a fifth region of the second conductivity type formed in the substrate. The second and the fifth regions are separated by a third channel region formed by the substrate.

A second conductive portion is formed over the third channel region and overlaps the second region. The second conductive portion is separated from the second region and the third channel region by the dielectric material. The second conductive portion includes a first downwardly extending portion which defines a first layer of thin tunneling dielectric material between the second conductive portion and the second region. The first layer of thin tunneling material is confined within the boundaries of the second region. The second conductive portion further includes a second downwardly extending portion which defines a second layer of thin tunneling dielectric material between the second conductive portion and the fourth region. The second layer of thin tunneling material is confined within the boundaries of the fourth region.

Other objects, features, and advantages of the present invention will appear from the following detailed description of a preferred embodiment, taken together with the accompanying drawings.

DETAILED DESCRIPTION OF A PREFERRED EMBODIMENT

Figures 1, 2A, 2C, 2D:
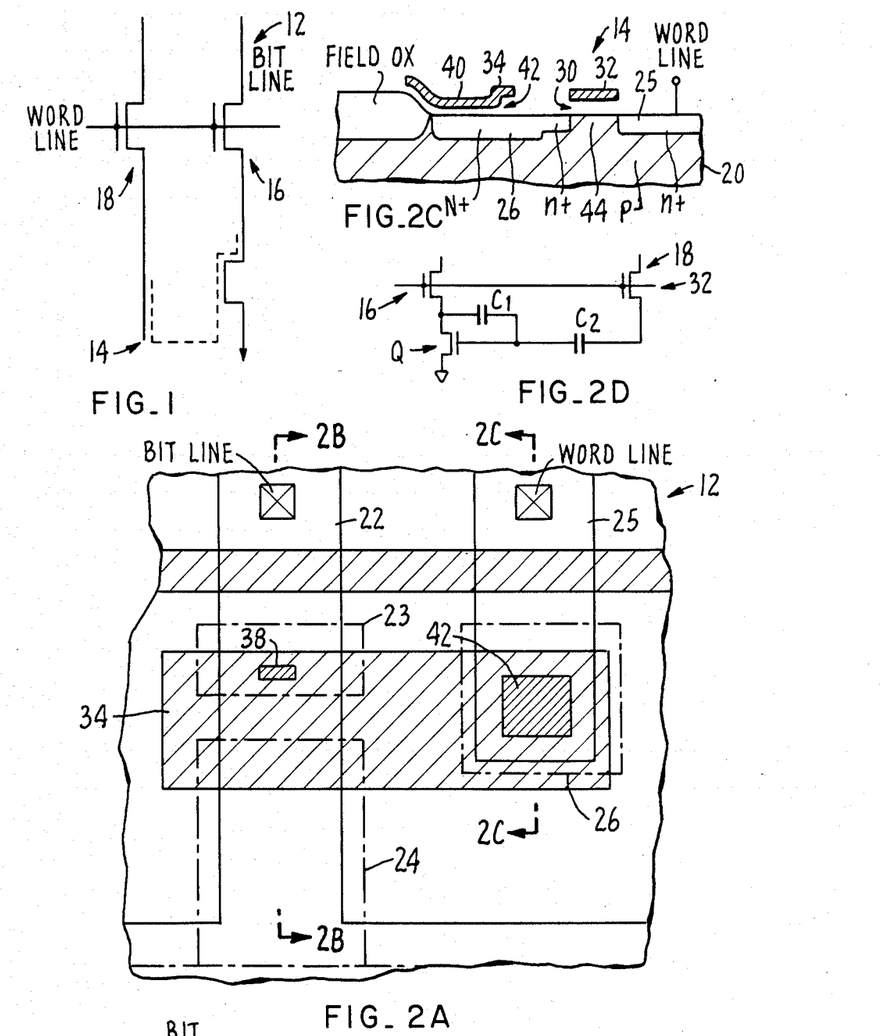
FIG. 1 is a simplified circuit schematic illustrating a single polysilicon layer EEPROM cell in accordance with the present invention.
FIG. 2A is a schematic plan view illustrating a single polysilicon layer EEPROM device in accordance with the present invention.
FIGS. 2B and 2C are cross-section views illustrating the single polysilicon layer EEPROM device of FIG. 2A, taken along lines 2B—2B and 2C—2C, respectively.
FIG. 2D is a simplified circuit schematic illustrating the single polysilicon layer EEPROM device of FIG. 2A.

FIG. 1 shows a simplified circuit schematic of a single polycrystalline silicon layer EEPROM device 12 in accordance with the present invention. Device 12 includes a memory cell 14 and control cells 16 and 18. Memory cell 14 is frequently referred to as a write/erase cell and control cells 16 and 18 are frequently referred to as pass or select transistor cells. In essence, each of memory cell 14 and control cells 16 and 18 is a field effect transistor that controls the current flow between the various regions of a semiconductor substrate 20, as described below. Control cell 18, in the preferred embodiment, is frequently referred to as a ninth column transistor. The gates of ninth column transistor 18 and pass transistor 16 are connected to a WORD LINE, and the drain of pass transistor 16 is connected to a BIT LINE.

Figure 2B:
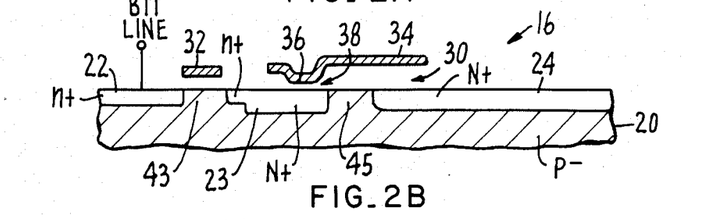

More particularly, device 12, as illustrated in FIGS. 2A–2C, comprises a silicon substrate 20 on which five doped regions are provided, designated 22, 23, 24, 25 and 26, respectively. Substrate 20 in the preferred embodiment is a silicon material having a first conductivity type, e.g., P−. Each of regions 22–26 include a doping material such that they are of a second conductivity type that is opposite to that of substrate 20, e.g., N+.

As best shown in FIGS. 2A and 2B, an oxide layer 30 is formed over regions 22, 23 and 24. For ease of description and illustration, oxide layer 30 is not explicitly illustrated. Formed above oxide layer 30 is a polycrystalline silicon, or polysilicon, layer that has been etched to provide two distinct portions. The first portion is designated 32; the second portion is designated 34. First polysilicon portion 32 has sufficient width so as to bridge the channel 43 formed by the substrate 20 between regions 22 and 23. As best shown in FIG. 2C, first polysilicon portion 32 also bridges the channel 44 formed by the substrate 20 between regions 25 and 26.

Second polysilicon portion 34 includes a first downwardly extending projection 36 which defines a layer 38 of thin oxide between portion 34 and region 23. The thickness of the oxide layer 38 between projection 36 and region 23 is approximately 85–100 Angstroms (Å); the typical thickness of oxide layer 30 is approximately 600 Å to 2,000 Å.

The layer of oxide 30 between projection 36 and region 23 is generally referred to as a thin tunneling oxide layer. Thin tunneling oxide layer 38 may be manufactured from processes described and claimed in U.S. application Ser. No. 905,245 and U.S. application Ser. No. 904,926, both of which were filed on Sept. 8, 1986 and which both copending and commonly assigned herewith by Farrokh Mohammadi, et al. Thin tunneling oxide layer 38 is illustrated in FIG. 2A as a double cross-hatched area.

Second polysilicon portion 34 also includes a second downwardly extending projection 40 which defines a layer 42 of thin oxide between portion 34 and region 26. Thin tunneling oxide layer 42 is also illustrated in FIG. 2A as a double cross-hatched area. Regions 25 and 26, first and second polysilicon portions 32 and 34, and thin tunneling oxide layer 42 combine to form memory cell 14.

Device 12 further includes both a metallic BIT LINE that is connected to region 22 and a polysilicon WORD LINE that is connected to region 25.

An object of the present invention, that is, minimization of the area of the memory cell, is partially satisfied by fabricating thin tunneling oxide layer 38 such that its area is substantially less than the area of thin tunneling oxide layer 42. In addition, thin tunneling oxide layer 38 is confined within the boundaries of drain implant region 23. Similarly, thin tunneling oxide layer 42 of memory cell 14 has an area that is confined within the boundaries of source implant region 26.

Each of memory cell 14 and control cells 16 and 18 controls the current flow between source and drain regions 2//24, 22/23 and 25/26, respectively. As best illustrated in FIG. 2D, regions 22 and 23, in conjunction with first polysilicon portion 32, form pass transistor 16. Similarly, regions 25 and 26, in conjunction with first polysilicon portion 32, form control or 9th column transistor 18. In addition, regions 23 and 24, which are separated by substrate channel 45, in conjunction with second polysilicon portion 34, form a third memory transistor, designated Q. Moreover, projection 36 and region 23 in conjunction with thin oxide layer 38 form a capacitor, designated $C_1$. Similarly, projection 40 and region 26 in conjunction with thin oxide layer 42 form a second capacitor, designated $C_2$.

To program memory cell 14, a programming voltage $V_{HI}$ is applied to region 26 to obtain a floating gate voltage $V_{FG}$ such that $$V_{FG}(C_1+C_2) = V_{HI} \cdot C_2 + \Delta Q \quad (1)$$

where $\Delta Q$ = is stored charge at polysilicon region 34. thus, $$V_{FG} = \frac{C_2}{C_2 + C_1} V_{HI} + \frac{\Delta Q}{C_2 + C_1} \quad (2)$$

To obtain the desired $V_{FG}$, therefor, the term $C_2/C_2+$Chd 1, in equation (2) should be as close to 1 as possible. In practice, in order to obtain a balanced P/E voltage and because of the trade-off between the size of capacitor $C_2$ in terms of acceptable cell size and process limitations on reducing the size of capacitor $C_2$ in terms of acceptable cell size and process limitations on reducing the size of capacitor $C_1$, the size of the two capacitors $C_1$ and $C_2$, i.e. the size of thin oxide layers 38 and 40, is chosen such that $$C_2/C_2 + C_1 \approx 0.7$$

This results in reduced capacitor area, reduced cell size and, thus, a reduction in the required programming voltage.

Furthermore, as shown in FIG. 2A, the cell cannot be subjected to any disturb condition, because both P/E controls are separated by pass transistors 16 and 18. Therefore, the cell is protected from P/E disturbs.

Figure 5:
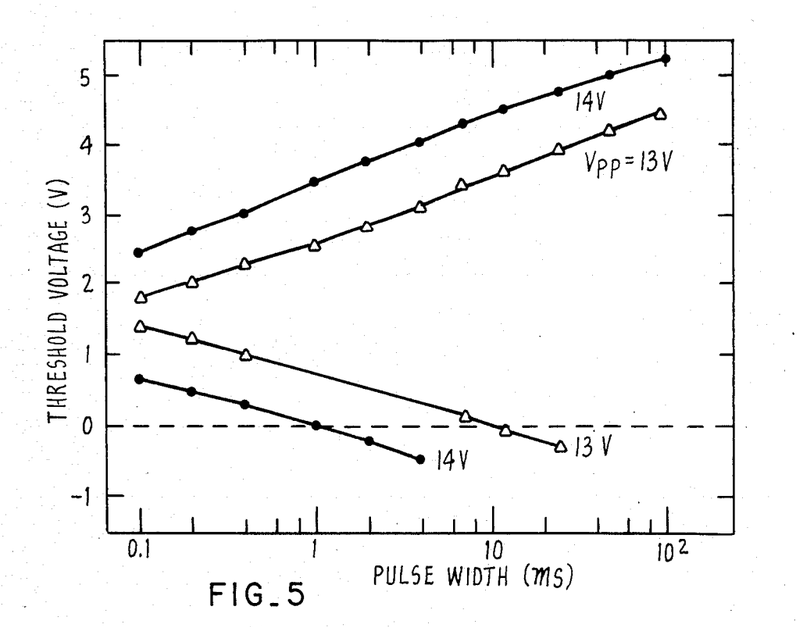
FIG. 5 is a graph illustrating program/erase voltage characteristics versus program/erase time for the single polysilicon EEPROM device of the present invention.

The program/erase (P/E) characteristics of cell 14 versus P/E time is shown in FIG. 5 where the cell 14 has been subjected to 13-14 volts of P/E voltage. The ratio of thin oxide opening areas is 6.4 and the thickness of the thin oxide is about 85 Angstroms.

Figure 6:
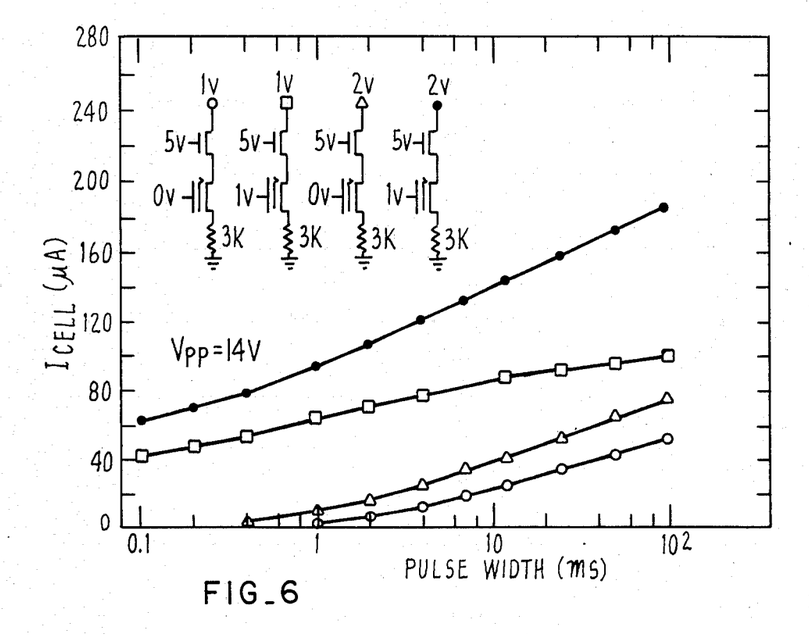
FIG. 6 is a graph illustrating the characteristics of the single polysilicon layer EEPROM device of the present invention during read conditions.

The characteristics of device 12 during read conditions are depicted in FIG. 6 for a drain voltage range of 1-5 volts and a gate voltage range of 0-2 volts. The lower the drain and gate voltage during the read operation, the better the long term read disturb condition of device 12 will be. However, lower gate and drain voltages will reduce the performance of device during addressing and sensing, respectively. To provide a realistic read condition, a source resistance of 3 K ohms is also included in the device 12.

Figure 7:
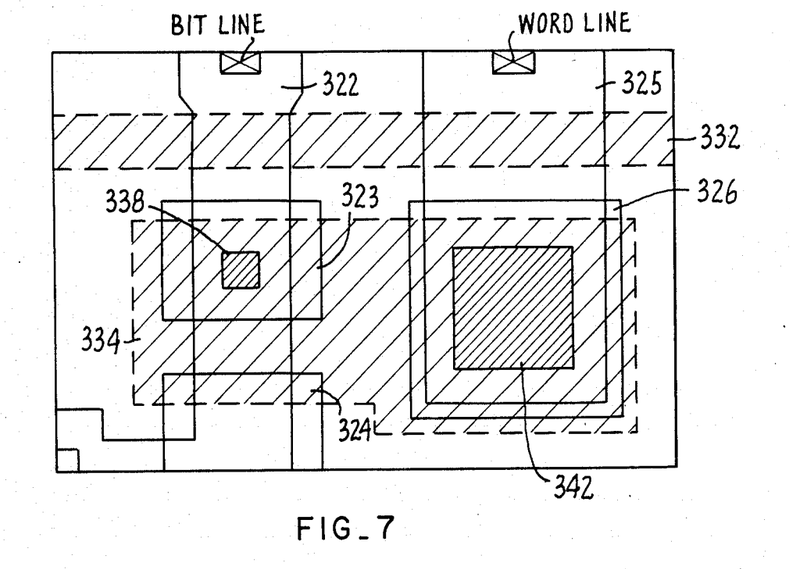
FIG. 7 is a schematic plan view illustrating a further alternative embodiment of the single polysilicon layer EEPROM device of the present invention.
Figure 8:
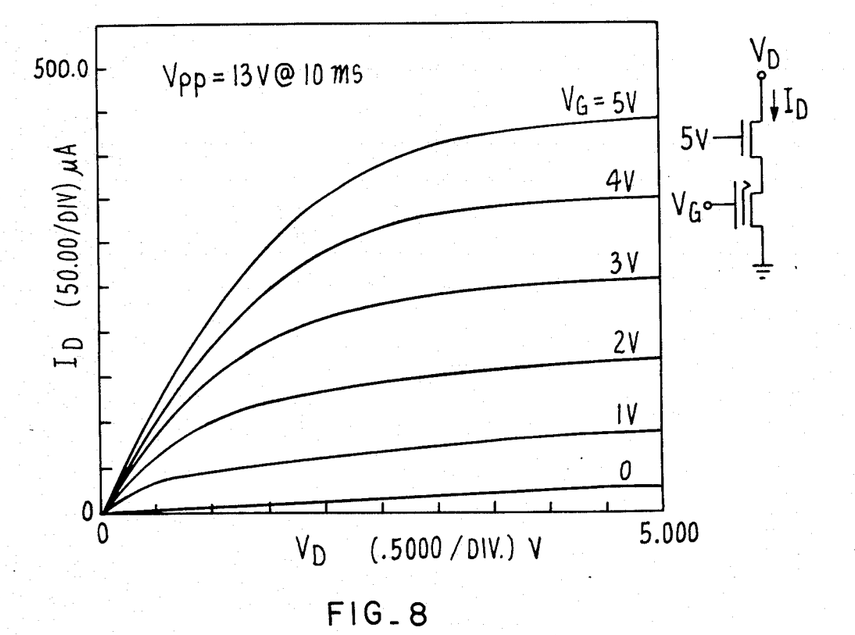
FIG. 8 is a graph illustrating the performance characteristics of the single polysilicon layer EEPROM device of FIG. 7.

An alternative cell design is shown in FIG. 7. The device configuration shown in FIG. 7 removes the problem of the long diffusion line and associated resistance in the source of the memory transistor of the FIG. 24 embodiment. Due to the improved cell current during the read operation, sensing of the cell current is improved which in turn enhances the speed of the device. The characteristics of the device shown in FIG. 7 are illustrated in FIG. 8 where the floating gate of the device has been previously positively charged by applying the $V_{PP} = 13$ volts at the device gate for a period of 10 milliseconds. During the operation of this embodiment, a read current of 100-120 micro amps is readily available at $V_g = 2$ and $V_d = 2$ volts. This insures proper operation of the cell with P/E voltages as low as 13 volts.

As for fabricating thin tunneling oxide layers 38 and 42, the method utilized in the preferred embodiment involves three requirements: (1) surface preparation, (2) growth of good quality oxide, and (3) minimization of irregularities.

To achieve proper surface preparation, a silicon wafer 20 is first placed in a conventional oxidation tube. A concentration of hydrochloric acid (HCl), oxygen ($O_2$) and nitrogen ($N_2$) is then pumped into the oxidation tube. HCl is capable of atomically cleaning the surface of substrate 20 so as to remove any undesirable elements. This surface preparation step also improves the quality of the substrate surface in that the condition generally referred to as "dangling bonds" is ameliorated. Nitrogen is merely a carrier for the oxygen, which then oxidizes a thin layer of substrate 20. This thin layer, generally referred to as a cap oxide, has a thickness of approximately 20-30 Å. This first step lasts for about 10-20 minutes at a flow rate of approximately 240 cubic centimeters (cc)/minute.

Next, a mixture of oxygen, hydrogen ($H_2$) and hydrochloric acid is pumped into the oxidation tube for approximately 5-10 minutes. The flow rate of this second step is approximately 4.75 liters/minute. The second step creates an additional oxide layer having a thickness of approximately 60-70 Å. In this step, the HCl is used to improve the quality of the silicon-to-oxygen interface. The chlorine molecules which reside at this interface eliminate bonding effects. Although the molecular action of the HCl is not understood at this time, the use of HCl is quite common. The result of the second step is that the layer of oxide, now approximately 85-100 Å in thickness, is a good quality oxide layer that is capable of enhancing the subsequent growth of the oxide layer, ultimately growing into a thickness that is designated oxide layer 30. Since the characteristic of any subsequent oxide growth is a reflection of the quality of any prior layer of oxide, the fabrication of this initial oxide layer is important. The first 40 minutes for growing oxide layer 30 is conducted at a temperature of approximately 800°-900° C. The temperature is then raised to approximately 950° C during the next 10 minutes and then stabilized for another 20 minutes. The plateauing of the temperature at 950° C also stabilizes the oxide. The entire substrate and the oxide layer are then cooled for approximately 2 hours.

Substrate 20 having oxide layer 30 thereon is removed from the oxidation tube and then placed in a poly deposition tube. Next, polysilicon portions 32 and 4 are deposited on oxide layer 30. The process parameters, except for temperature, are conventional. For example, the pressure is set at approximately 180 mm of mercury. Silane ($SiH_4$) is fed into the poly deposition tube at a rate of approximately 50 cc/minute. The deposition of polysilicon occurs at a rate of approximately 25 Å/minute.

The temperature used during the deposition of polysilicon is approximately 560° C. At this temperature, two phenomena occur. First, the lower surface of the polysilicon layer develops an amorphous structure. In conventional polysilicon layers, the structure is referred to as "textured". The lower surface of the polysilicon layer which in essence is also the lower surface of projection 36 or 40, is the interface between projection 36/40 and thin tunneling oxide layer 38/42, respectively. For ease of description, the lower surface and the interface are not separately designated in the present invention. Second, the sharp edges or surface irregularities at the interface are minimized. Since the fabrication steps are more fully described and illustrated in U.S. application Ser. No. 905,245, that application is hereby incorporated by reference into the instant application.

Having the thickness of thin tunneling oxide layers 38 and 42 in the 85-100 Å range, large capacitance is created while the physical dimension of the capacitors are maintained at a minimal value.

Figure 3A:
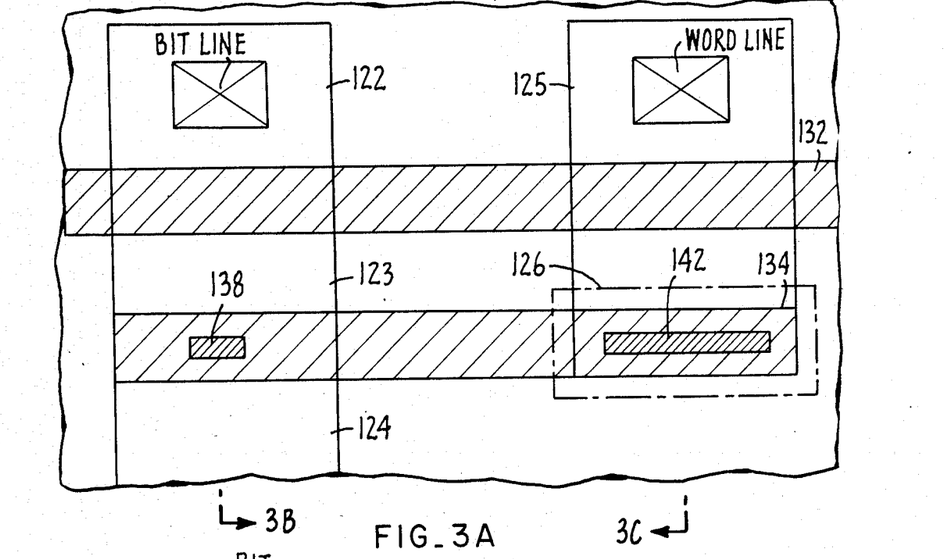
FIG. 3A is a schematic plan view illustrating an alternative embodiment of the single polysilicon layer EEPROM device of FIGS. 2A–2D.
Figure 3B:
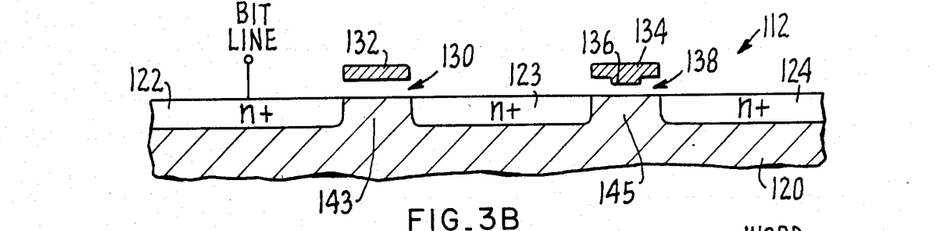
FIGS. 3B and 3C are cross-sectional views illustrating the alternative embodiment of FIG. 3A, taken along lines 3B–3B and 3C–3C, respectively.
Figure 3C:
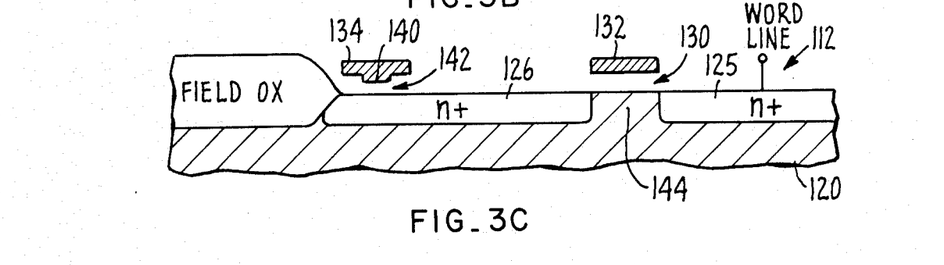

FIGS. 3A-3C illustrate an alternative embodiment 112 to the single polysilicon layer EEPROM device 12. Since alternative embodiment EEPROM device 112 is similar to device 12, the numerical designations for the elements of device 112 are provided by adding a numeral "1" before the numerals designating the corresponding elements of device 12.

Figure 4A:
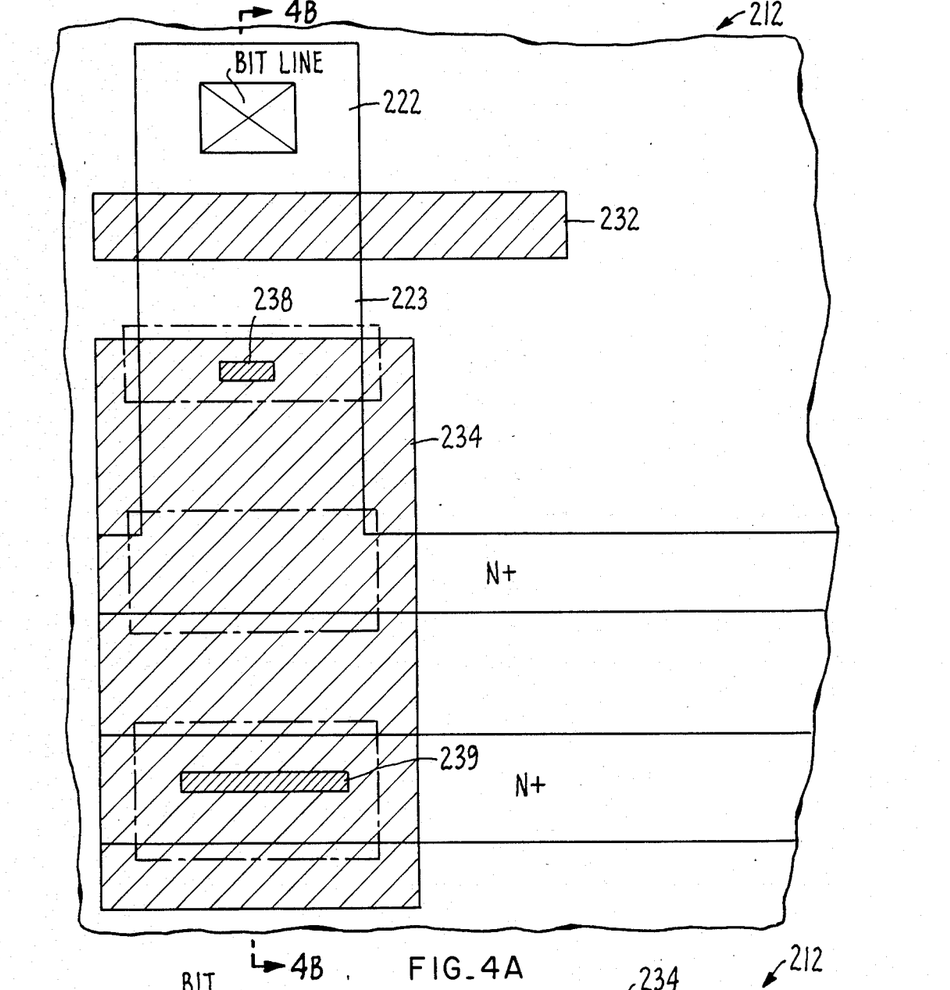
FIG. 4A is a schematic plan view illustrating a further alternative embodiment of the single polysilicon EEPROM device of FIGS. 2A–2D.
Figure 4B:
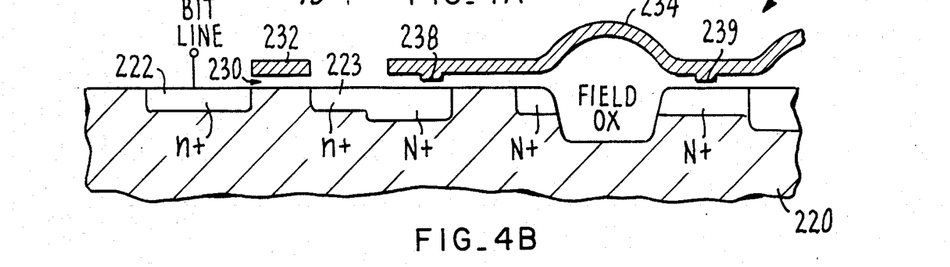
FIG. 4B is a cross-section view illustrating the further alternative embodiment of FIG. 4A, taken along line 4B–4B.

FIGS. 4A and 4B illustrate a further alternative embodiment of single polysilicon layer EEPROM device 12, designated 212. Since further alternative embodiment EEPROM 212 contains elements which are similar to both device 12 and alternative embodiment device 112, the numerical designation for the elements of device 212 are provided by adding a numeral "2" before the numeral designating the corresponding elements in device 12. Device 212 differs from device 12 in that only a BIT LINE is illustrated. In addition, second polysilicon portion 234 differs from the corresponding polysilicon portion 34 of device 12 in that portion 234 includes two downwardly extending projections, designated 238 and 239. This cell does not include the 9th column transistor.

It will be apparent to those skilled in the art that modifications may be made within the spirit of the invention and the scope of the appended claims.

What is claimed is:

1. A memory device of the type used in an electrically erasable programmable read only memory array comprising a matrix of intersection bit lines and word lines having a memory device formed at intersections of the bit lines and word lines, the memory device comprising:
   a semiconductor substrate (20) of a first conductivity type;
   a first field effect transistor comprising first and second regions (22, 23) of a second conductivity type, opposite to that of the first conductivity type, formed in the substrate, the first and second regions (22, 23) being separated by a first channel region (43) formed by the substrate, and a first conductive portion (32) formed over the first channel region and separated from the first channel region by a dielectric layer (30) to provide the gate of the first field effect transistor, the first region (22) being connected to the bit line, the first conductive portion (32) being connected to the word line;
   a second field effect transistor comprising third and fourth regions (25,26) of the second conductivity type formed in the substrate, the third and fourth regions (25,26) being separated by a second channel region (44) formed by the substrate, the first conductive region (44) formed by the substrate, the first conductive portion (32) extending over the second channel region (44) and separated from the second channel region (44) by the dielectric layer (30) to provide the gate of the second field effect transistor; and
   a third field effect transistor comprising the second region (23) and a fifth region (24) of the second conductivity type formed in the substrate, the second and fifth regions (23, 24) being separated by a third channel region (45) formed by the substrate, and a second conductive portion (34) formed over the third channel region (45) to provide the gate of the third field effect transistor and extending to overlap both the second region (23) and the fourth region (26), the second conductive portion (34) being separated from the second region (23), the fourth region (26) and the third channel region (45) by the dielectric layer (30), the second conductive portion (34) including a first downwardly extending portion (36) which defines a first layer (38) of thin tunneling dielectric material between the second conductive portion (34) and the second region (23) and a second downwardly extending portion (40) which defines a second layer (42) of thin tunneling dielectric material between the second conductive portion (34) and the fourth region (26).

2. A memory device as in claim 1 wherein the first layer (38) of thin tunneling material is confined within the boundaries of the second region (23).

3. A memory device as in claim 2 wherein the second layer (42) of thin tunneling material is confined within the boundaries of the fourth region (26).

4. A memory device as in claim 3 wherein the area of first layer (38) is substantially smaller than the area of second layer (42).

5. A memory device as in claim 1 wherein the substrate is of p⁻ conductivity and the first, second, third, fourth and fifth regions are of N⁺ conductivity.

6. A memory device as in claim 1 wherein both the first conductive portion are polycrystalline silicon.

7. A memory device as in claim 1 wherein both the first layer and the second layer are silicon oxide.

8. A memory device as in claim 7 wherein both the first layer and the second layer are about 85-100 Angstroms thick.

9. A single-poly electrically erasable programmable read only memory device comprising:
   a semiconductor substrate (20) of a first conductivity type;
   a pass cell comprising first and second regions (22, 23) of a second conductivity type, opposite to that of the first conductivity type, formed in the substrate, the first and second regions (22, 23) being separated by a first channel region (43) formed by the substrate, and a first conductive portion (32) formed over the first channel region and separated from the first channel region by a dielectric layer (30);
   a control cell comprising third and fourth regions (25, 26) of the second conductivity type formed in the substrate, the third and fourth regions (25, 26) being separated by a second channel region (44) formed by the substrate, the first conductive portion (32) extending over the second channel region (44) and separated from the second channel region (44) by the dielectric layer (30); and a memory cell comprising the second region (23) and a fifth region (24) of the second conductivity type formed in the substrate, the second and fifth regions (23, 24) being separated by a third channel region (45) formed by the substrate, and a second conductive portion (34) formed over the third channel region (45) and overlapping the second region (23), the second conductive portion (34) being separated from the second region (23) and the third channel region (45) by the dielectric layer (30), the second conductive portion (34) including a first downwardly extending portion (36) which defines a first layer (38) of thin tunneling dielectric material between the second conductive portion (34) and the second region (23), the first layer (38) of thin tunneling material being confined within the boundaries of the second region (23), the second conductive portion (34) further including a second downwardly extending portion (40) which defines a second layer (42) of thin tunneling dielectric material between second conductive portion (34) and the fourth region (26), the second layer (42) of thin tunneling material being confined within the boundaries of the fourth region (26) and wherein the area of first layer (38) is substantially smaller than the area of second layer (42).

* * * * *

UNITED STATES PATENT AND TRADEMARK OFFICE
CERTIFICATE OF CORRECTION

PATENT NO. : 4,807,003
DATED : February 21, 1989
INVENTOR(S) : Farrokh Mohammadi and Chan S. Pang It is certified that error appears in the above - identified patent and that said Letters Patent is hereby corrected as shown below:

Column 2, Line 33, "÷852" should be --'852--.

Column 2, Line 61, after "by", first occurrence, insert -- a --.

Column 4, Line 5 "18;" should be --18,--.

Column 5, Line 3, "2//24" should be --23/24--.

Column 5, Line 29, "$C_2 /C_2 + Chd\ 1$" should be --$C_2/C_2 + C_1$--.

Column 6, Line 62, "4" should be --34--.

Column 7, Line 50, "intersection" should be --intersecting--.

Column 8, Line 45, after the word "portion" and before the word "are" insert --and the second conductive portion--.

Signed and Sealed this

Eighteenth Day of July, 1989

Attest:

DONALD J. QUIGG

Attesting Officer

Commissioner of Patents and Trademarks